(12) United States Patent
Wakata

(10) Patent No.: US 8,378,763 B2
(45) Date of Patent: Feb. 19, 2013

(54) LAYERED BANDPASS FILTER

(75) Inventor: Eiko Wakata, Tokyo (JP)

(73) Assignee: TDK Corporation, Tokyo (JP)

( * ) Notice: Subject to any disclaimer, the term of this patent is extended or adjusted under 35 U.S.C. 154(b) by 375 days.

(21) Appl. No.: 12/890,120

(22) Filed: Sep. 24, 2010

(65) Prior Publication Data

US 2011/0074527 A1 Mar. 31, 2011

(30) Foreign Application Priority Data

Sep. 29, 2009 (JP) ................. 2009-223676

(51) Int. Cl.
*H01P 1/203* (2006.01)
*H03H 7/32* (2006.01)

(52) U.S. Cl. ....................... 333/204; 333/175

(58) Field of Classification Search .............. 333/202, 333/204, 175, 185, 138
See application file for complete search history.

(56) References Cited

U.S. PATENT DOCUMENTS 7,109,829 B2* 9/2006 Kosaka et al. ............... 333/204
7,468,642 B2* 12/2008 Bavisi et al. ................. 333/168
7,667,557 B2* 2/2010 Chen ............................. 333/185
7,990,231 B2* 8/2011 Morikaku et al. ............ 333/175

FOREIGN PATENT DOCUMENTS

| JP | A-11-41004 | 2/1999 |
| JP | A-2006-033614 | 2/2006 |
| JP | A-2006-054508 | 2/2006 |
| JP | A-2008-035565 | 2/2008 |

* cited by examiner

*Primary Examiner* — Dean O Takaoka
(74) *Attorney, Agent, or Firm* — Oliff & Berridge, PLC

(57) ABSTRACT

A bandpass filter includes three resonators of which adjacent two are electromagnetically coupled to each other, and two coupling paths connected in parallel for forming capacitive coupling between non-adjacent two of the resonators. Each of the two coupling paths includes at least one capacitor and an inductor connected in series. The two coupling paths function to form an attenuation pole at a frequency lower than the passband frequencies in the pass attenuation characteristics of the bandpass filter.

5 Claims, 8 Drawing Sheets

REALTED ART

LAYERED BANDPASS FILTER

BACKGROUND OF THE INVENTION

1. Field of the Invention

The present invention relates to a layered bandpass filter including three or more resonators that are provided within a layered structure including a plurality of stacked dielectric layers.

2. Description of the Related Art

Recently employed communication devices include those for wireless LANs (local area networks), those compatible with Bluetooth® technology, those compatible with WiMAX® (worldwide interoperability for microwave access) technology, and cell phones. While required to be reduced in size and thickness, these wireless communication devices are each required to process signals of systems that are in various different frequency bands. Electronic components used in these wireless communication devices include a bandpass filter which filters transmission and reception signals. Band-pass filters are also required to be reduced in size and thickness. A bandpass filter that is responsive to usable frequency bands of the aforementioned wireless communication devices and can be reduced in size and thickness is disclosed, for example, in each of JP 2006-033614A, JP 2006-054508A, and JP 11-041004A. The bandpass filter is a layered bandpass filter with a plurality of resonators provided within a layered structure including a plurality of stacked dielectric layers. In the layered bandpass filter, two adjacent resonators are electromagnetically coupled to each other. The electromagnetic coupling includes inductive coupling and capacitive coupling.

The layered bandpass filter disclosed in each of JP 2006-033614A and JP 2006-054508A includes three or more resonators, two adjacent ones of which are electromagnetically coupled to each other. In the layered bandpass filter, a coupling path including a capacitor is provided to form capacitive coupling between two resonators not adjacent to each other. In terms of pass attenuation characteristics of a bandpass filter, the provision of such a coupling path allows the formation of an attenuation pole at a frequency lower than the passband frequencies. This provides better attenuation characteristics of the bandpass filter at frequencies lower than those of the passband.

As disclosed in JP 2006-033614A and JP 2006-054508A, if the layered bandpass filter including three or more resonators is provided with the coupling path for forming capacitive coupling between two resonators not adjacent to each other, spurious may occur at a frequency higher than the passband frequencies due to the provision of the coupling path. A possible reason for the occurrence of spurious is as follows. The aforementioned coupling path includes, in addition to the capacitor, a conductive path that is connected in series to the capacitor. The conductive path has inductance, and is therefore considered as an inductor. Accordingly, the coupling path is considered as a series resonant circuit formed by the capacitor and the inductor. The resonant frequency of the series resonant circuit is generally higher than the passband frequencies. As a result, in terms of pass attenuation characteristics of the bandpass filter, a peak of reduction of attenuation (hereinafter referred to as low attenuation's peak) occurs at a frequency higher than the passband frequencies due to the presence of the series resonant circuit. The frequency at which the low attenuation's peak occurs is the resonant frequency of the series resonant circuit. The low attenuation's peak degrades the attenuation characteristics of the bandpass filter at frequencies higher than those of the passband. The low attenuation's peak especially generates spurious of a frequency that is the frequency of the low attenuation's peak, or a frequency close to the frequency of the low attenuation's peak.

The low attenuation's peak occurs noticeably if the layered structure is composed of a plurality of dielectric layers of a high permittivity in order to respond to a need to reduce insertion loss in the passband, in particular.

A bandpass filter used in wireless communication devices is required to reduce insertion loss in the passband, and in some cases, is required to have such a characteristic that attenuation in a specific frequency band within the stopband is equal to or higher than a predetermined level. For example, in the case of a wireless communication device for processing signals of a plurality of systems in various different frequency bands, a bandpass filter used in one of the systems may be required to have such a characteristic that attenuation in a frequency band of a signal of a different one of the systems is equal to or higher than a predetermined level. In this situation, if the frequency at which the aforementioned low attenuation's peak occurs is within the frequency band in which attenuation is required to be equal to or higher than a predetermined level, the bandpass filter may fail to achieve its desirable characteristics.

This may be prevented by reducing at least either the capacitance of the capacitor or the inductance of the inductor in the series resonant circuit to shift the resonant frequency of the series resonant circuit, namely, the frequency at which the low attenuation's peak occurs, to a higher side than the frequency band in which attenuation is required to be equal to or higher than a predetermined level. However, reduction in capacitance or inductance may result in a failure to form an attenuation pole at a frequency lower than the passband frequencies, or may change the frequency or attenuation of the attenuation pole. In either case, the coupling path fails to fulfill its original function.

The bandpass filter disclosed in each of JP 2006-033614A and JP 2006-054508A includes two adjusting electrodes for forming capacitors between the adjusting electrodes and two resonant electrodes not adjacent to each other, and a connecting electrode for electrically connecting the two adjusting electrodes to each other. Each of these publications also discloses the technique of reducing spurious (low attenuation's peak) occurring at a frequency higher than the passband frequencies by reducing electrostatic capacitance generated between the connecting electrode and a resonant electrode that is provided between the two resonant electrodes not adjacent to each other. However, this technique cannot shift the frequency at which the low attenuation's peak occurs to the outside of the frequency band in which attenuation is required to be equal to or higher than a predetermined level.

JP 11-041004A discloses the technique of shifting the position of occurrence of undesired resonance, which occurs at a frequency higher than the passband frequencies due to the presence of a conductor layer for forming capacitive coupling between adjacent resonators, to a still higher frequency. However, this publication does not disclose a coupling path for forming capacitive coupling between two resonators not adjacent to each other, nor any solution to problems relating to the low attenuation's peak generated by the provision of the coupling path.

OBJECT AND SUMMARY OF THE INVENTION

As described above, a low attenuation's peak occurs at a frequency higher than the passband frequencies as a result of the provision of a coupling path for forming an attenuation pole at a frequency lower than the passband frequencies. Thus, it is an object of the present invention to provide a layered bandpass filter capable of controlling the frequency at which the low attenuation's peak occurs, without impairing the function of the coupling path.

A layered bandpass filter of the present invention includes: a layered structure including a plurality of dielectric layers stacked; three or more resonators provided within the layered structure such that adjacent two of the resonators are electromagnetically coupled to each other; and a plurality of coupling paths connected in parallel, for forming capacitive coupling between non-adjacent two of the resonators. Each of the coupling paths includes at least one capacitor and an inductor connected in series.

In the layered bandpass filter of the present invention, the three or more resonators and the plurality of coupling paths may each be formed of a plurality of conductor layers provided within the layered structure.

In the layered bandpass filter of the present invention, the plurality of coupling paths may have respective different resonant frequencies.

In the layered bandpass filter of the present invention, each of the three or more resonators may be a quarter-wave resonator having an open end and a short-circuited end. The plurality of coupling paths may electrically connect the open ends of the non-adjacent two of the resonators to each other.

In the layered bandpass filter of the present invention, the at least one capacitor may be two capacitors, and the inductor may electrically connect the two capacitors to each other.

As described above, the layered bandpass filter of the present invention includes a plurality of coupling paths connected in parallel for forming capacitive coupling between two resonators not adjacent to each other. Each of the coupling paths includes at least one capacitor and an inductor connected in series. In the present invention, the frequency and the attenuation of an attenuation pole formed at a frequency lower than the passband frequencies depend mainly on the combined capacitance of a plurality of capacitors included in the plurality of coupling paths. Further, in the present invention, the plurality of coupling paths each form a series resonant circuit. The resonant frequency of each of the coupling paths (series resonant circuits) depends on the capacitance of the capacitor(s) and the inductance of the inductor in the coupling path. According to the present invention, the combined capacitance of the plurality of capacitors included in the plurality of coupling paths can therefore be set to a value suitable for forming an attenuation pole, and the capacitance of the capacitor(s) and the inductance of the inductor in each of the coupling paths can be adjusted so as to control the resonant frequency of each of the coupling paths (series resonant circuits), namely, the frequency at which the low attenuation's peak occurs. Thus, when a low attenuation's peak is to occur at a frequency higher than the passband frequencies due to the provision of a coupling path for forming an attenuation pole at a frequency lower than the passband frequencies, it is possible according to the present invention to control the frequency at which the low attenuation's peak occurs, without impairing the function of the coupling path.

Other and further objects, features and advantages of the invention will appear more fully from the following description.

DETAILED DESCRIPTION OF THE PREFERRED EMBODIMENT

Figure 1:
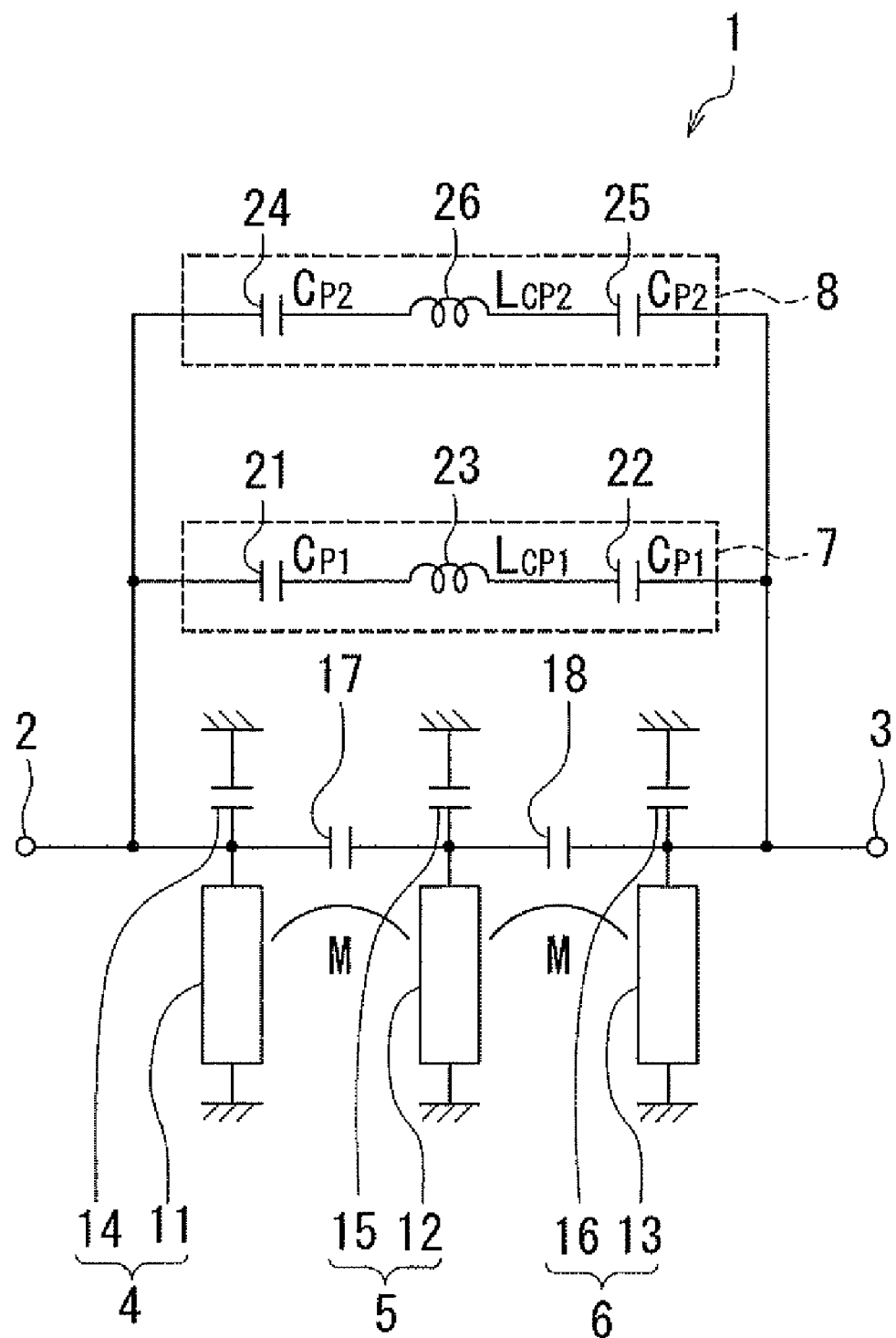
FIG. 1 is a circuit diagram showing the circuit configuration of a layered bandpass filter according to an embodiment of the invention.

A preferred embodiment of the present invention will now be described in detail with reference to the drawings. First, reference is made to FIG. 1 to describe the circuit configuration of a layered bandpass filter according to the embodiment of the invention. The layered bandpass filter (hereinafter, simply referred to as bandpass filter) 1 according to the embodiment includes an input terminal 2, an output terminal 3, three resonators 4, 5 and 6, two coupling paths 7 and 8 connected in parallel, and capacitors 17 and 18. The input terminal 2 is for receiving signals. The output terminal 3 is for outputting the signals. The resonator 4 is electrically connected to the input terminal 2. The resonator 6 is electrically connected to the output terminal 3. In terms of circuit configuration, the resonator 5 is located between the resonator 4 and the resonator 6. The resonators 4 and 5 are adjacent to each other and electromagnetically coupled to each other. The resonators 5 and 6 are adjacent to each other and electromagnetically coupled to each other. The electromagnetic coupling includes inductive coupling and capacitive coupling.

The resonator 4 includes an inductor 11 and a capacitor 14 electrically connected to each other. The resonator 5 includes an inductor 12 and a capacitor 15 electrically connected to each other. The resonator 6 includes an inductor 13 and a capacitor 16 electrically connected to each other. The inductors 11 and 12 are inductively coupled to each other. Likewise, the inductors 12 and 13 are inductively coupled to each other. In FIG. 1, the inductive coupling between the inductors 11 and 12 and the inductive coupling between the inductors 12 and 13 are shown with curves M.

One end of the inductor 11 and one end of each of the capacitors 14 and 17 are electrically connected to the input terminal 2. The other end of the inductor 11 and the other end of the capacitor 14 are electrically connected to the ground. One end of the inductor 12 and one end of each of the capacitors 15 and 18 are electrically connected to the other end of the capacitor 17. The other end of the inductor 12 and the other end of the capacitor 15 are electrically connected to the ground. One end of the inductor 13, one end of the capacitor 16, and the output terminal 3 are electrically connected to the other end of the capacitor 18. The other end of the inductor 13 and the other end of the capacitor 16 are electrically connected to the ground. The resonator 5 is inductively coupled to the resonator 4 by the inductive coupling between the inductors 11 and 12, and is capacitively coupled to the resonator 4 via the capacitor 17. The resonator 5 is inductively coupled to the resonator 6 by the inductive coupling between the inductors 12 and 13, and is capacitively coupled to the resonator 6 via the capacitor 18.

The resonators 4, 5 and 6 are quarter-wave resonators each having an open end and a short-circuited end. These quarter-wave resonators take advantage of making the physical lengths of the inductors 11, 12 and 13 shorter than one-quarter wavelength by using the capacitors 14, 15 and 16, respectively. Regarding the resonator 4, the connection point between the inductor 11 and the capacitor 14 is the open end, and the ends of the inductor 11 and the capacitor 14 closer to the ground are the short-circuited end. Regarding the resonator 5, the connection point between the inductor 12 and the capacitor 15 is the open end, and the ends of the inductor 12 and the capacitor 15 closer to the ground are the short-circuited end. Regarding the resonator 6, the connection point between the inductor 13 and the capacitor 16 is the open end, and the ends of the inductor 13 and the capacitor 16 closer to the ground are the short-circuited end.

The coupling paths 7 and 8 form capacitive coupling between the two resonators 4 and 6 not adjacent to each other. The coupling paths 7 and 8 are arranged in parallel so as to electrically connect the open ends of the resonators 4 and 6 to each other. More specifically, one end of each of the coupling paths 7 and 8 is electrically connected to the input terminal 2 and the open end of the resonator 4, while the other end of each of the coupling paths 7 and 8 is electrically connected to the output terminal 3 and the open end of the resonator 6.

The coupling path 7 includes capacitors 21 and 22, and an inductor 23 that electrically connects the capacitors 21 and 22 to each other. One end of the capacitor 21 is electrically connected to the input terminal 2 and the open end of the resonator 4. The other end of the capacitor 21 is electrically connected to one end of the inductor 23. The other end of the inductor 23 is electrically connected to one end of the capacitor 22. The other end of the capacitor 22 is electrically connected to the output terminal 3 and the open end of the resonator 6. The coupling path 7 provides a series resonant circuit formed by the capacitor 21, the inductor 23, and the capacitor 22 connected in series.

The coupling path 8 includes capacitors 24 and 25, and an inductor 26 that electrically connects the capacitors 24 and 25 to each other. One end of the capacitor 24 is electrically connected to the input terminal 2 and the open end of the resonator 4. The other end of the capacitor 24 is electrically connected to one end of the inductor 26. The other end of the inductor 26 is electrically connected to one end of the capacitor 25. The other end of the capacitor 25 is electrically connected to the output terminal 3 and the open end of the resonator 6. The coupling path 8 provides a series resonant circuit formed by the capacitor 24, the inductor 26, and the capacitor 25 connected in series.

In terms of pass attenuation characteristics of the bandpass filter 1, the coupling paths 7 and 8 function to form an attenuation pole at a frequency lower than the passband frequencies. The frequency and the attenuation of the attenuation pole depend mainly on the combined capacitance of the capacitors 21, 22, 24 and 25 included in the coupling paths 7 and 8.

In the bandpass filter 1 according to the embodiment, when signals are received at the input terminal 2, those having frequencies within the passband of the bandpass filter 1 are output selectively from the output terminal 3.

Figure 2:
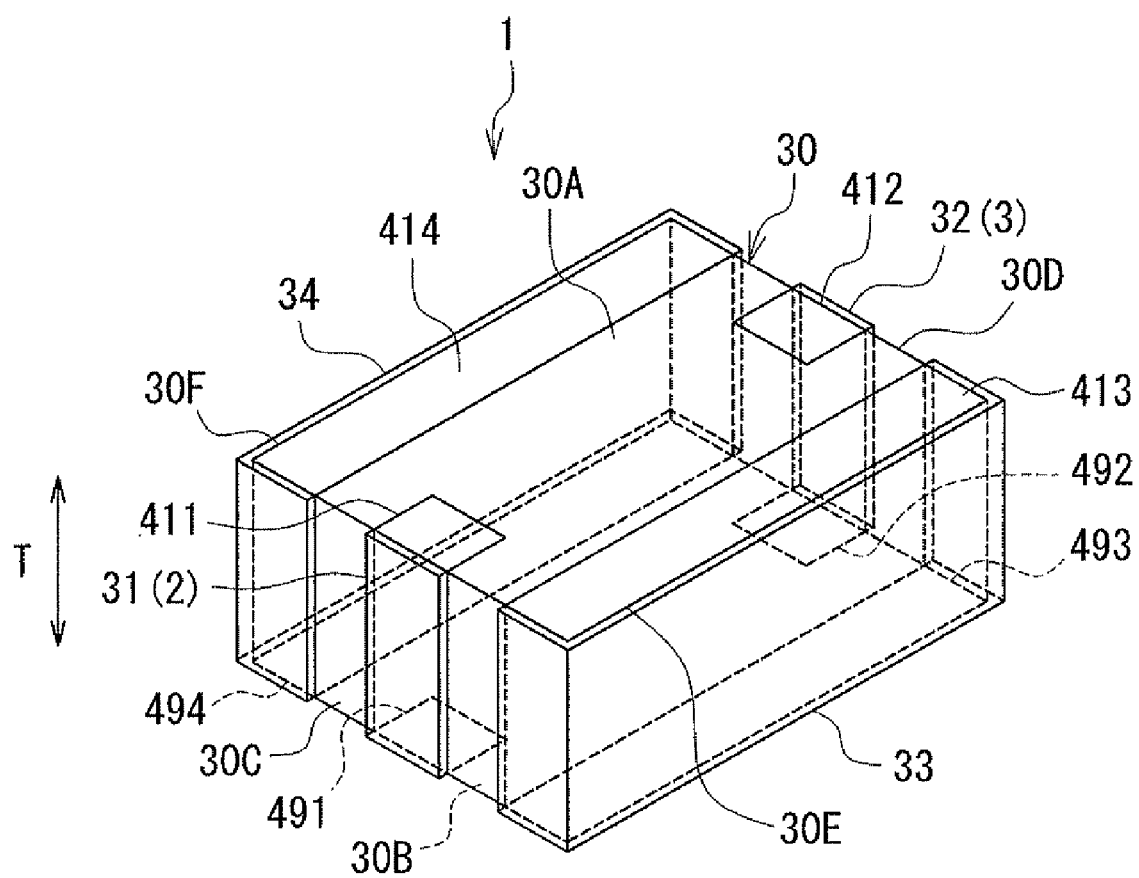
FIG. 2 is a perspective view showing the outer appearance of the layered bandpass filter according to the embodiment of the invention.

Now, with reference to FIG. 2, the structure of the bandpass filter 1 will be outlined. FIG. 2 is a perspective view showing the outer appearance of the bandpass filter 1. The bandpass filter 1 includes a layered structure 30 for uniting the components of the bandpass filter 1. As will be described in detail later, the layered structure 30 is composed of a stack of a plurality of dielectric layers and a plurality of conductor layers.

The layered structure 30 is in the shape of a rectangular solid. The layered structure 30 has outer surfaces including a top surface 30A, a bottom surface 30B, and four side surfaces 30C to 30F. The top and bottom surfaces 30A and 30B are opposite each other. The side surfaces 30C and 30D are opposite each other, and the side surfaces 30E and 30F are opposite each other. The side surfaces 30C to 30F are perpendicular to the top and bottom surfaces 30A and 30B. In the layered structure 30, the direction perpendicular to the top and bottom surfaces 30A and 30B is the direction in which the plurality of dielectric layers and the plurality of conductor layers are stacked. In FIG. 2, the stacking direction is indicated by an arrowed line with a symbol T.

The bandpass filter 1 further includes a conductor layer 31 for input, a conductor layer 32 for output, and conductor layers 33 and 34 for ground that are provided on the outer surfaces of the layered structure 30. The conductor layer 31 is provided on the side surface 30C. The conductor layer 32 is provided on the side surface 30D. The conductor layer 33 is provided on the side surface 30E. The conductor layer 34 is provided on the side surface 30F. The conductor layers 31 to 34 are each rectangular in plan view.

One end of the conductor layer 31 for input is located on the ridge between the top surface 30A and the side surface 30C. The other end of the conductor layer 31 for input is located on the ridge between the bottom surface 30B and the side surface 30C. The conductor layer 31 for input forms the input terminal 2.

One end of the conductor layer 32 for output is located on the ridge between the top surface 30A and the side surface 30D. The other end of the conductor layer 32 for output is located on the ridge between the bottom surface 30B and the side surface 30D. The conductor layer 32 for output forms the output terminal 3.

One end of the conductor layer 33 for ground is located on the ridge between the top surface 30A and the side surface 30E. The other end of the conductor layer 33 for ground is located on the ridge between the bottom surface 30B and the side surface 30E. The conductor layer 33 for ground is connected to the ground.

One end of the conductor layer 34 for ground is located on the ridge between the top surface 30A and the side surface 30F. The other end of the conductor layer 34 for ground is located on the ridge between the bottom surface 30B and the side surface 30F. The conductor layer 34 for ground is connected to the ground.

Figure 3A:
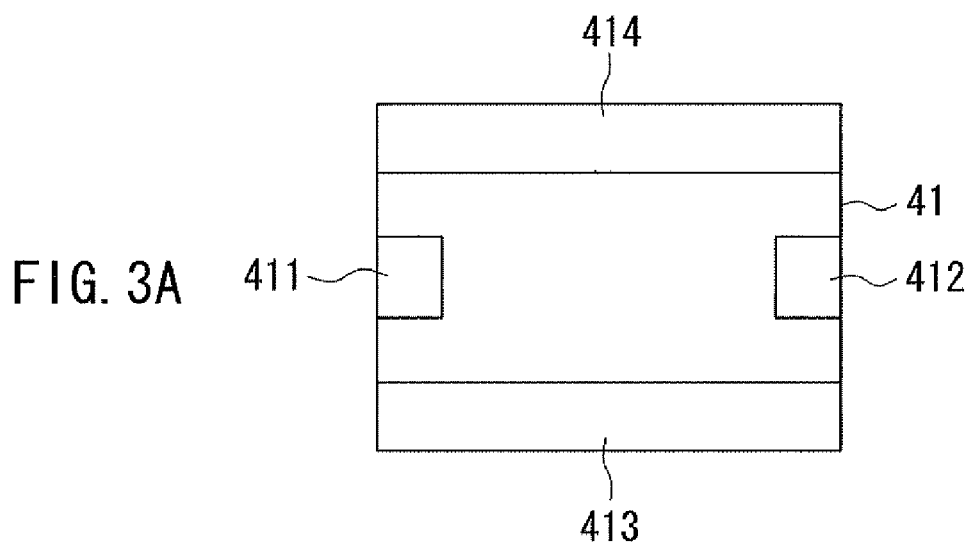
FIG. 3A to FIG. 3O are explanatory diagrams showing the top surfaces of first to third dielectric layers of a layered structure of the embodiment of the invention.
Figure 3B:
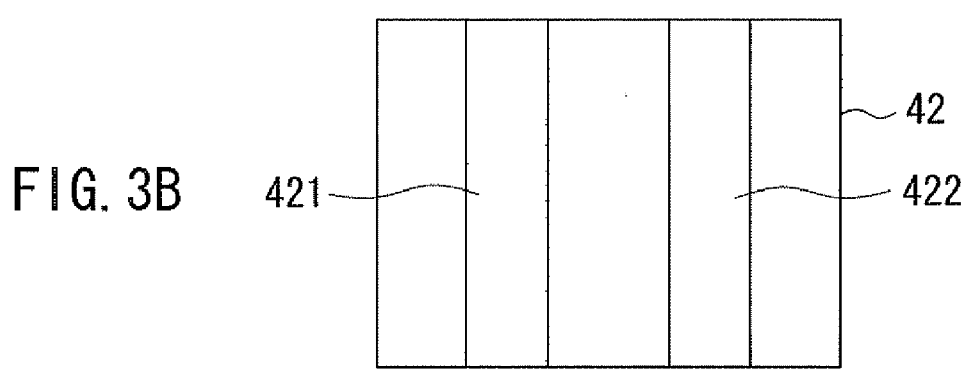
Figure 3C:
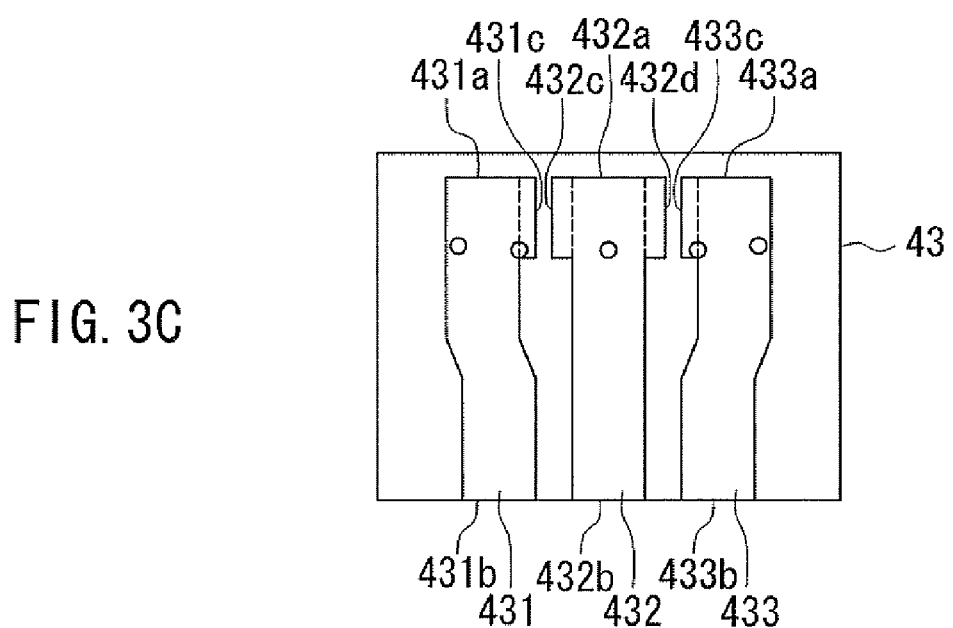
Figure 4A:
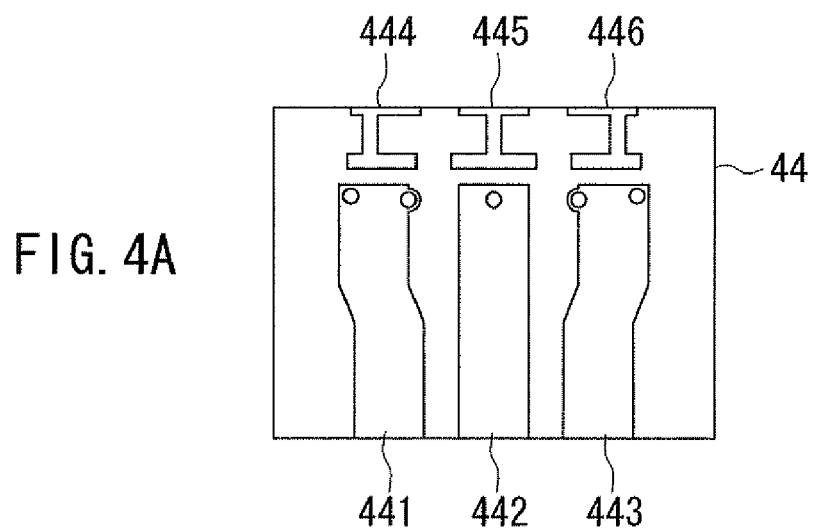
FIG. 4A to FIG. 4C are explanatory diagrams showing the top surfaces of fourth to sixth dielectric layers of the layered structure of the embodiment of the invention.
Figure 4B:
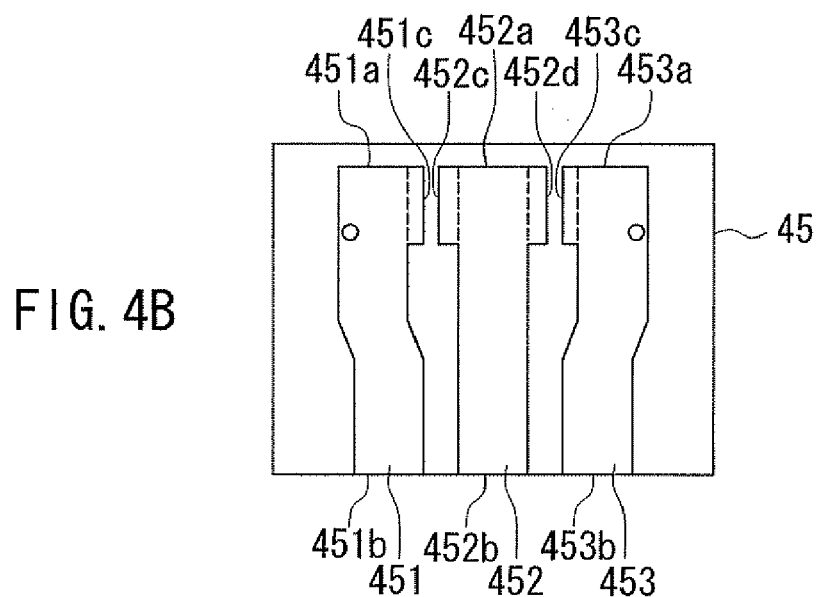
Figure 4C:
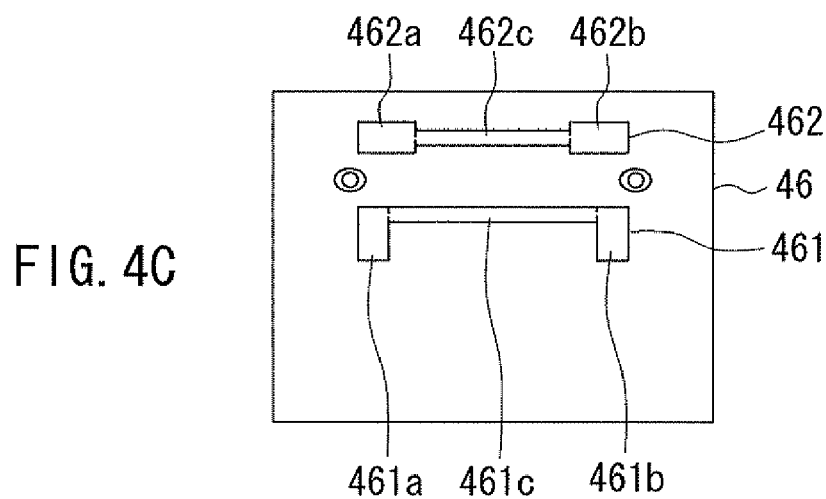
Figure 5A:
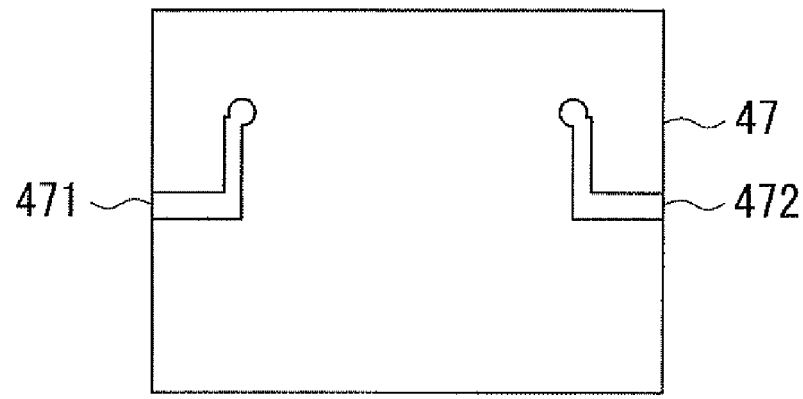
FIG. 5A to FIG. 5C are explanatory diagrams showing the top surfaces of seventh and eighth dielectric layers of the layered structure of the embodiment of the invention, and showing a ninth dielectric layer and conductor layers located thereunder.
Figure 5B:
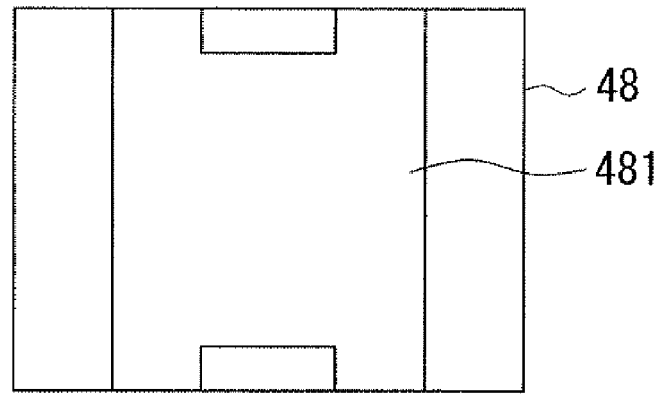
Figure 5C:
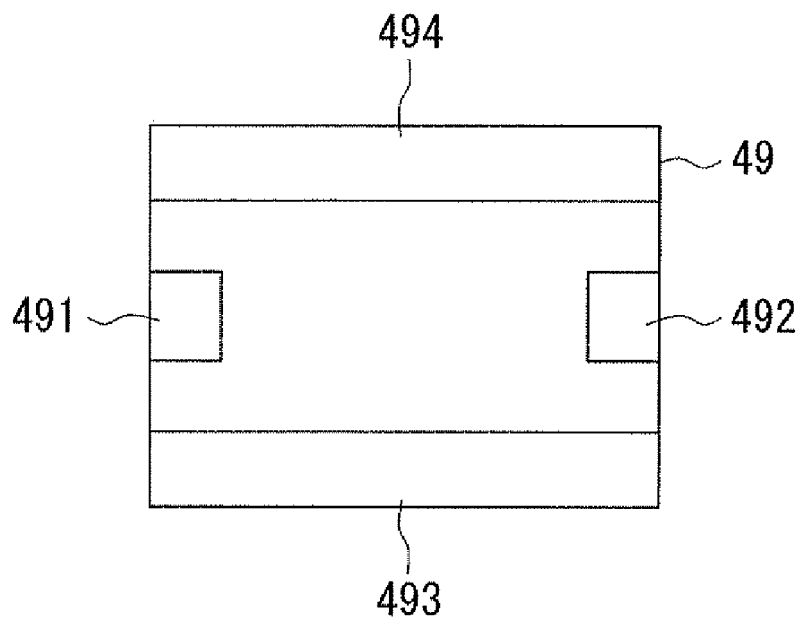

The layered structure 30 will be described in more detail with reference to FIG. 3A to FIG. 3C, FIG. 4A to FIG. 4C, and FIG. 5A to FIG. 5C. FIG. 3A to FIG. 3C show the top surfaces of the first to third dielectric layers from the top, respectively. FIG. 4A to FIG. 4C show the top surfaces of the fourth to sixth dielectric layers from the top, respectively. FIG. 5A and FIG. 5B show the top surfaces of the seventh and eighth dielectric layers from the top, respectively. FIG. 5C shows the ninth dielectric layer from the top and conductor layers under the ninth dielectric layer, as viewed from above. Circles in FIG. 3C and FIG. 4A to FIG. 4C indicate through holes.

On the top surface of the first dielectric layer 41 shown in FIG. 3A, i.e., on the top surface 30A of the layered structure 30, there are formed conductor layers 411, 412, 413 and 414. The conductor layer 411 is connected to the conductor layer 31 for input. The conductor layer 412 is connected to the conductor layer 32 for output. The conductor layer 413 is connected to the conductor layer 33 for ground. The conductor layer 414 is connected to the conductor layer 34 for ground.

On the top surface of the second dielectric layer 42 shown in FIG. 3B, there are formed conductor layers 421 and 422. The conductor layers 421 and 422 are both connected to the conductor layers 33 and 34 for ground.

On the top surface of the third dielectric layer 43 shown in FIG. 3C, there are formed conductor layers 431, 432 and 433 for resonator. The conductor layers 431, 432 and 433 are arranged in this order from the left in the horizontal direction in FIG. 3C. The conductor layer 431 has a first end 431a, a second end 431b opposite to the first end 431a, and a projection 431c located near the first end 431a and projecting toward the conductor layer 432. The conductor layer 432 has a first end 432a, a second end 432b opposite to the first end 432a, a projection 432c located near the first end 432a and projecting toward the conductor layer 431, and a projection 432d located near the first end 432a and projecting toward the conductor layer 433. The conductor layer 433 has a first end 433a, a second end 433b opposite to the first end 433a, and a projection 433c located near the first end 433a and projecting toward the conductor layer 432. The second ends 431b, 432b and 433b are connected to the conductor layer 33 for ground. The projections 431c and 432c are opposed to each other. The projections 432d and 433c are opposed to each other.

The dielectric layer 43 has two through holes connected to the conductor layer 431 at positions near the first end 431a, a through hole connected to the conductor layer 432 at a position near the first end 432a, and two through holes connected to the conductor layer 433 at positions near the first end 433a.

On the top surface of the fourth dielectric layer 44 shown in FIG. 4A, there are formed conductor layers 441, 442 and 443 for resonator, and conductor layers 444, 445 and 446. The conductor layers 441, 442 and 443 are arranged in this, order from the left in the horizontal direction in FIG. 4A. The conductor layers 444, 445 and 446 are placed between the respective upper ends of the conductor layers 441, 442 and 443 in FIG. 4A and the upper side of the top surface of the dielectric layer 44 in FIG. 4A. The conductor layers 444, 445 and 446 are connected to the conductor layer 34 for ground. The respective other ends of the conductor layers 441, 442 and 443 are connected to the conductor layer 33 for ground.

The dielectric layer 44 has two through holes connected to the conductor layer 441, a through hole connected to the conductor layer 442, and two through holes connected to the conductor layer 443. The two through holes connected to the conductor layer 441 are further connected to the two through holes connected to the conductor layer 431. The through hole connected to the conductor layer 442 is further connected to the through hole connected to the conductor layer 432. The two through holes connected to the conductor layer 443 are further connected to the two through holes connected to the conductor layer 433.

On the top surface of the fifth dielectric layer 45 shown in FIG. 4B, there are formed conductor layers 451, 452 and 453 for resonator. The conductor layers 451, 452 and 453 are arranged in this order from the left in the horizontal direction in FIG. 4B. The conductor layer 451 has a first end 451a, a second end 451b opposite to the first end 451a, and a projection 451c located near the first end 451a and projecting toward the conductor layer 452. The conductor layer 452 has a first end 452a, a second end 452b opposite to the first end 452a, a projection 452c located near the first end 452a and projecting toward the conductor layer 451, and a projection 452d located near the first end 452a and projecting toward the conductor layer 453. The conductor layer 453 has a first end 453a, a second end 453b opposite to the first end 453a, and a projection 453c located near the first end 453a and projecting toward the conductor layer 452. The second ends 451b, 452b and 453b are connected to the conductor layer 33 for ground. The projections 451c and 452c are opposed to each other. The projections 452d and 453c are opposed to each other. The conductor layers 431 and 441 are connected to the conductor layer 451 through a plurality of through holes formed in the dielectric layers 43 and 44. The conductor layers 432 and 442 are connected to the conductor layer 452 through a plurality of through holes formed in the dielectric layers 43 and 44. The conductor layers 433 and 443 are connected to the conductor layer 453 through a plurality of through holes formed in the dielectric layers 43 and 44.

The dielectric layer 45 has a through hole connected to the conductor layer 451 at a position near the first end 451a, and a through hole connected to the conductor layer 453 at a position near the first end 453a.

On the top surface of the sixth dielectric layer 46 shown in FIG. 4C, there are formed conductor layers 461 and 462. The conductor layers 461 and 462 both extend in the horizontal direction in FIG. 4C. The conductor layer 462 is placed between the conductor layer 461 and the upper side of the top surface of the dielectric layer 46 in FIG. 4C. The conductor layer 461 has two capacitor-forming parts 461a and 461b, and a connecting part 461c connecting the capacitor-forming parts 461a and 461b to each other. The connecting part 461c has a width (dimension in the vertical direction in FIG. 4C) smaller than that of the capacitor-forming parts 461a and 461b. The conductor layer 462 has two capacitor-forming parts 462a and 462b, and a connecting part 462c connecting the capacitor-forming parts 462a and 462b to each other. The connecting part 462c has a width smaller than that of the capacitor-forming parts 462a and 462b. The dielectric layer 46 has two through holes connected to the two through holes formed in the dielectric layer 45.

On the top surface of the seventh dielectric layer 47 shown in FIG. 5A, there are formed conductor layers 471 and 472. The conductor layer 471 is connected to the conductor layer 31 for input. The conductor layer 472 is connected to the conductor layer 32 for output. The conductor layers 431, 441 and 451 are connected to the conductor layer 471 through a plurality of through holes formed in the dielectric layers 43 to 46. The conductor layers 433, 443 and 453 are connected to the conductor layer 472 through a plurality of through holes formed in the dielectric layers 43 to 46.

On the top surface of the eighth dielectric layer 48 shown in FIG. 5B, there is formed a conductor layer 481. The conductor layer 481 is connected to the conductor layers 33 and 34 for ground.

On the bottom surface of the ninth dielectric layer 49 shown in FIG. 5C, i.e., on the bottom surface 30B of the layered structure 30, there are formed conductor layers 491, 492, 493 and 494. The conductor layer 491 is connected to the conductor layer 31 for input. The conductor layer 492 is connected to the conductor layer 32 for output. The conductor layer 493 is connected to the conductor layer 33 for ground. The conductor layer 494 is connected to the conductor layer 34 for ground.

The inductor 11 shown in FIG. 1 is formed of the conductor layers 431, 441 and 451 for resonator which are connected to each other through a plurality of through holes formed in the dielectric layers 43 and 44. The inductor 12 shown in FIG. 1 is formed of the conductor layers 432, 442 and 452 for resonator which are connected to each other through a plurality of through holes formed in the dielectric layers 43 and 44. The inductor 13 shown in FIG. 1 is formed of the conductor layers 433, 443 and 453 for resonator which are connected to each other through a plurality of through holes formed in the dielectric layers 43 and 44.

The conductor layer 444 is opposed to the conductor layer 431 for resonator with the dielectric layer 43 interposed therebetween, and is opposed to the conductor layer 451 for resonator with the dielectric layer 44 interposed therebetween. One end of the conductor layer 444 faces the conductor layer 441 for resonator. The capacitor 14 shown in FIG. 1 is formed of the conductor layers 431, 441, 444 and 451 and the dielectric layers 43 and 44. The conductor layer 445 is opposed to the conductor layer 432 for resonator with the dielectric layer 43 interposed therebetween, and is opposed to the conductor layer 452 for resonator with the dielectric layer 44 interposed therebetween. One end of the conductor layer 445 faces the conductor layer 442 for resonator. The capacitor 15 shown in FIG. 1 is formed of the conductor layers 432, 442, 445 and 452 and the dielectric layers 43 and 44. The conductor layer 446 is opposed to the conductor layer 433 for resonator with the dielectric layer 43 interposed therebetween, and is opposed to the conductor layer 453 for resonator with the dielectric layer 44 interposed therebetween. One end of the conductor layer 446 faces the conductor layer 443 for resonator. The capacitor 16 shown in FIG. 1 is formed of the conductor layers 433, 443, 446 and 453 and the dielectric layers 43 and 44.

The projections 431c and 432c of the conductor layers 431 and 432 for resonator are opposed to each other. The projections 451c and 452c of the conductor layers 451 and 452 for resonator are opposed to each other. The capacitor 17 shown in FIG. 1 is formed of the projections 431c, 432c, 451c and 452c. The projections 432d and 433c of the conductor layers 432 and 433 for resonator are opposed to each other. The projections 452d and 453c of the conductor layers 452 and 453 for resonator are opposed each other. The capacitor 18 shown in FIG. 1 is formed of the projections 432d, 433c, 452d and 453c.

The coupling path 7 shown in FIG. 1 is formed of the conductor layers 451, 453 and 461 and the dielectric layer 45. The coupling path 8 shown in FIG. 1 is formed of the conductor layers 451, 453 and 462 and the dielectric layer 45. A detailed description will now be given of the capacitors 21 and 22 and the inductor 23 which constitute the coupling path 7, and the capacitors 24 and 25 and the inductor 26 which constitute the coupling path 8.

The capacitor-forming part 461a of the conductor layer 461 is opposed to a part near the first end 451a of the conductor layer 451 for resonator with the dielectric layer 45 interposed therebetween. The capacitor-forming part 461b of the conductor layer 461 is opposed to a part near the first end 453a of the conductor layer 453 for resonator with the dielectric layer 45 interposed therebetween. The capacitor 21 shown in FIG. 1 is formed of the conductor layer 451, the capacitor-forming part 461a, and the dielectric layer 45. The capacitor 22 shown in FIG. 1 is formed of the conductor layer 453, the capacitor-forming part 461b, and the dielectric layer 45. The inductor 23 shown in FIG. 1 is formed of the connecting part 461c of the conductor layer 461.

The capacitor-forming part 462a of the conductor layer 462 is opposed to a part near the first end 451a of the conductor layer 451 for resonator with the dielectric layer 45 interposed therebetween. The capacitor-forming part 462b of the conductor layer 462 is opposed to a part near the first end 453a of the conductor layer 453 for resonator with the dielectric layer 45 interposed therebetween. The capacitor 24 shown in FIG. 1 is formed of the conductor layer 451, the capacitor-forming part 462a, and the dielectric layer 45. The capacitor 25 shown in FIG. 1 is formed of the conductor layer 453, the capacitor-forming part 462b, and the dielectric layer 45. The inductor 26 shown in FIG. 1 is formed of the connecting part 462c of the conductor layer 462.

The dielectric layers 41 to 49 and the plurality of conductor layers shown in FIG. 3A to FIG. 3C, FIG. 4A to FIG. 4C, and FIG. 5A to 5C are stacked into the layered structure 30 shown in FIG. 2. The conductor layers 31 to 34 shown in FIG. 2 are formed on the outer surfaces of the layered structure 30.

Various materials including resin, ceramic, and a composite of resin and ceramic are employable to form the dielectric layers 41 to 49. In particular, for better high frequency characteristics, the layered structure 30 is preferably such one that the dielectric layers 41 to 49 are formed of ceramic by a low-temperature co-firing method. In order to reduce insertion loss in the passband, it is preferable that the dielectric layers 41 to 49 be formed of a material having a high permittivity. As one example, the relative permittivity of the dielectric layers 41 to 49 is 75.

As described above, the bandpass filter 1 according to the embodiment includes: the layered structure 30 including the plurality of dielectric layers stacked; the three resonators 4, 5 and 6 provided within the layered structure 30 such that adjacent two of the resonators are electromagnetically coupled to each other; and the two coupling paths 7 and 8 connected in parallel, for forming capacitive coupling between the resonators 4 and 6 not adjacent to each other. The coupling path 7 provides a series resonant circuit formed by the capacitor 21, the inductor 23, and the capacitor 22 connected in series. The coupling path 8 provides a series resonant circuit formed by the capacitor 24, the inductor 26, and the capacitor 25 connected in series. The resonators 4, 5 and 6, and the coupling paths 7 and 8 are each formed of a plurality of conductor layers provided within the layered structure 30.

The operation and effects of the coupling paths 7 and 8 in the bandpass filter 1 according to the embodiment will now be described in detail. As has been described, in terms of pass attenuation characteristics of the bandpass filter 1, the coupling paths 7 and 8 function to form an attenuation pole at a frequency lower than the passband frequencies. The frequency and the attenuation of the attenuation pole depend mainly on the combined capacitance of the capacitors 21, 22, 24 and 25 included in the coupling paths 7 and 8. In order to simplify the description, as shown in FIG. 1, the capacitance of the capacitors 21 and 22 will be denoted as $C_{P1}$, and the capacitance of the capacitors 24 and 25 will be denoted as $C_{P2}$. The inductance of the inductor 23 will be denoted as $L_{CP1}$, and the inductance of the inductor 26 will be denoted as $L_{CP2}$. The combined capacitance of the capacitors 21, 22, 24 and 25 is $C_{P1}/2+C_{P2}/2$.

The resonant frequency $f_1$ of the coupling path 7 (series resonant circuit) depends on the capacitance $C_{P1}$ of the capacitors 21 and 22, and the inductance $L_{CP1}$ of the inductor 23. Likewise, the resonant frequency $f_2$ of the coupling path 8 (series resonant circuit) depends on the capacitance $C_{P2}$ of the capacitors 24 and 25, and the inductance $L_{CP2}$ of the inductor 26. The resonant frequencies $f_1$ and $f_2$ are expressed by the following formulas (1) and (2), respectively.

$$f_1 = 1/2\pi\sqrt{(L_{CP1} \times C_{P1}/2)} = 1/\pi\sqrt{(2L_{CP1} \times C_{P1})} \quad (1)$$

$$f_2 = 1/2\pi\sqrt{(L_{CP2} \times C_{P2}/2)} = 1/\pi\sqrt{(2L_{CP2} \times C_{P2})} \quad (2)$$

For the bandpass filter 1 according to the embodiment, a low attenuation's peak resulting from the provision of the coupling path 7 (series resonant circuit) occurs at the position of the resonant frequency $f_1$ higher than the passband frequencies, and a low attenuation's peak resulting from the provision of the coupling path 8 (series resonant circuit) occurs at the position of the resonant frequency $f_2$ higher than the passband frequencies. If the resonant frequencies $f_1$ and $f_2$ are equal, the low attenuation's peak resulting from the provision of the coupling path 7 and that resulting from the provision of the coupling path 8 coincide with each other. Accordingly, in this case, there is seemingly only one low attenuation's peak at a frequency higher than the passband frequencies.

According to the embodiment, it is possible to form an attenuation pole by setting the combined capacitance of the capacitors 21, 22, 24 and 25 included in the coupling paths 7 and 8 to a value suitable for forming the attenuation pole. Further, according to the embodiment, it is possible to control the resonant frequencies $f_1$ and $f_2$ of the coupling paths 7 and 8, namely, the frequencies at which the low attenuation's peaks occur, by adjusting the capacitance $C_{P1}$ of the capacitors 21 and 22 and the inductance $L_{CP1}$ of the inductor 23 in the coupling path 7, and by adjusting the capacitance $C_{P2}$ of the capacitors 24 and 25 and the inductance $L_{CP2}$ of the inductor 26 in the coupling path 8. Thus, when low attenuation's peaks are to occur at frequencies higher than those of the passband due to the provision of the coupling paths 7 and 8 for forming an attenuation pole at a frequency lower than the passband frequencies, it is possible according to the embodiment to control the frequencies at which the low attenuation's peaks occur, without impairing the function of the coupling paths 7 and 8.

The capacitance $C_{P1}$ of the capacitors 21 and 22 can be controlled, for example, by varying the areas of the capacitor-forming parts 461a and 461b of the conductor layer 461. The inductance $L_{CP1}$ of the inductor 23 can be controlled, for example, by varying the width of the connecting part 461c of the conductor layer 461. The capacitance $C_{P2}$ of the capacitors 24 and 25 can be controlled, for example, by varying the areas of the capacitor-forming parts 462a and 462b of the conductor layer 462. The inductance $L_{CP2}$ of the inductor 26 can be controlled, for example, by varying the width of the connecting part 462c of the conductor layer 462.

Figure 6:
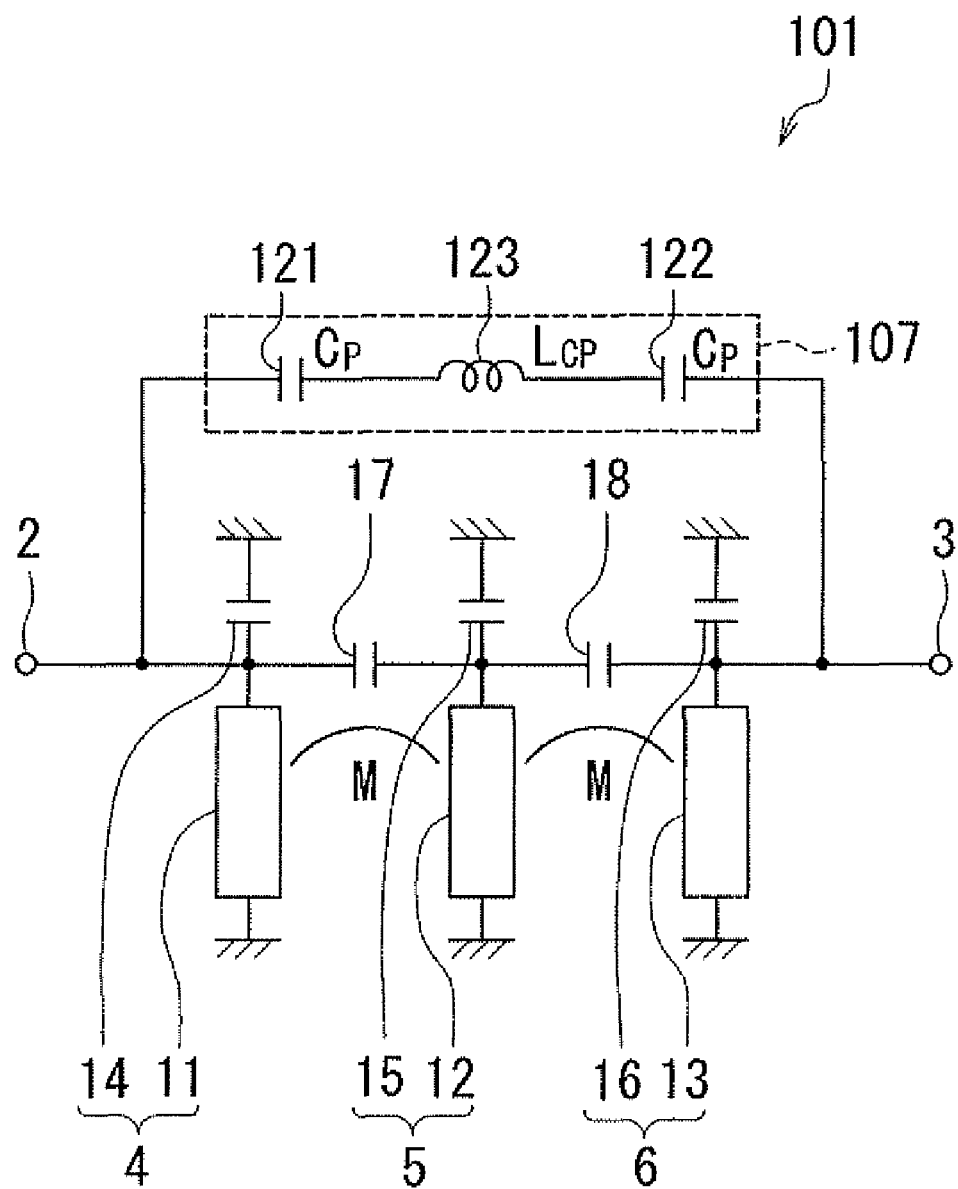
FIG. 6 is a circuit diagram showing the circuit configuration of a layered bandpass filter of a comparative example.

Now, the operation and effects of the coupling paths 7 and 8 will be described in more detail by making comparison between the bandpass filter 1 according to the embodiment and a bandpass filter of a comparative example. Reference is now made to FIG. 6 to describe the circuit configuration of the bandpass filter 101 of the comparative example. As shown in FIG. 6, the bandpass filter 101 of the comparative example includes a coupling path 107 as a counterpart of the coupling path 7 of the bandpass filter 1 shown in FIG. 1, and does not include the coupling path 8. The coupling path 107 includes capacitors 121 and 122 and an inductor 123, as counterparts of the capacitors 21 and 22 and the inductor 23. The configuration of the bandpass filter 101 of the comparative example is otherwise the same as that of the bandpass filter 1.

Figure 7:
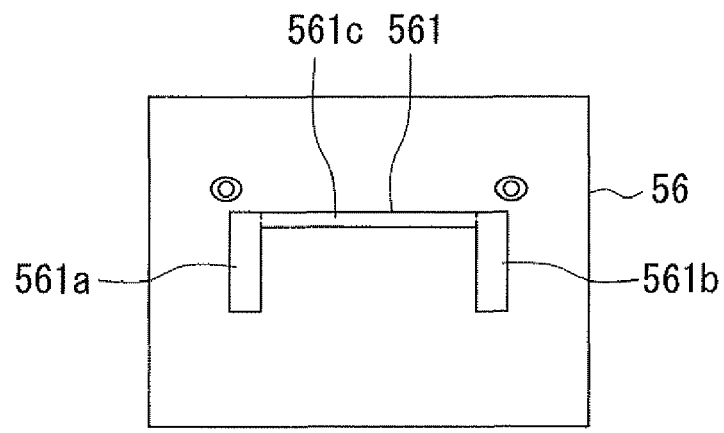
FIG. 7 is an explanatory diagram showing the top surface of a sixth dielectric layer of the layered structure of the layered bandpass filter of the comparative example.

Next, a description will be given of differences of the layered structure of the bandpass filter 101 of the comparative example from the layered structure 30 of the bandpass filter 1. FIG. 7 shows the top surface of a sixth dielectric layer 56 from the top of the layered structure of the bandpass filter 101. Circles in FIG. 7 indicate through holes. The layered structure of the bandpass filter 101 of the comparative example includes the dielectric layer 56 shown in FIG. 7, as a counterpart of the sixth dielectric layer 46 of the layered structure 30 of the bandpass filter 1. A conductor layer 561 is formed on the top surface of the dielectric layer 56. The conductor layer 561 has two capacitor-forming parts 561a and 561b, and a connecting part 561c connecting the capacitor-forming parts 561a and 561b to each other. The dielectric layer 56 has two through holes connected to the two through holes formed in the dielectric layer 45 shown in FIG. 4B. The configuration of the layered structure of the bandpass filter 101 of the comparative example is otherwise the same as that of the layered structure 30 of the bandpass filter 1.

The coupling path 107 of the bandpass filter 101 of the comparative example is formed of the conductor layers 451 and 453 on the dielectric layer 45 shown in FIG. 4B, the conductor layer 561, and the dielectric layer 45. The capacitor-forming part 561a of the conductor layer 561 is opposed to the conductor layer 451 for resonator with the dielectric layer 45 interposed therebetween. The capacitor-forming part 561b of the conductor layer 561 is opposed to the conductor layer 453 for resonator with the dielectric layer 45 interposed therebetween. The capacitor 121 shown in FIG. 6 is formed of the conductor layer 451, the capacitor-forming part 561a, and the dielectric layer 45. The capacitor 122 shown in FIG. 6 is formed of the conductor layer 453, the capacitor-forming part 561b, and the dielectric layer 45. The inductor 123 shown in FIG. 6 is formed of the connecting part 561c of the conductor layer 561.

In terms of pass attenuation characteristics of the bandpass filter 101, the coupling path 107 functions to form an attenuation pole at a frequency lower than the passband frequencies. The frequency and the attenuation of the attenuation pole depend mainly on the combined capacitance of the capacitors 121 and 122. In order to simplify the description, as shown in FIG. 6, the capacitance of the capacitors 121 and 122 will be denoted as $C_P$, and the inductance of the inductor 123 will be denoted as $L_{CP}$. The combined capacitance of the capacitors 121 and 122 is $C_P/2$.

The coupling path 107 provides a series resonant circuit formed by the capacitor 121, the inductor 123, and the capacitor 122 connected in series. The resonant frequency $f_0$ of the coupling path 107 (series resonant circuit) is expressed by the following formula.

$$f_0 = 1/2\pi\sqrt{(L_{CP} \times C_P/2)} = 1/\pi\sqrt{(2L_{CP} \times C_P)} \quad (3)$$

For the bandpass filter 101 of the comparative example, a low attenuation's peak resulting from the provision of the coupling path 107 (series resonant circuit) occurs at the position of the resonant frequency $f_0$ higher than the passband frequencies.

Now, with reference to FIG. 8 and FIG. 9, a description will be given of the results of a first simulation which was performed to obtain the pass attenuation characteristics of the bandpass filter 101 of the comparative example. In the simulation, the bandpass filter 101 was designed to have a passband of approximately 2.4 to 2.5 GHz to obtain its pass attenuation characteristics. The frequency band of 2.4 to 2.5 GHz corresponds to one of frequency bands used in wireless LANs. In each of FIG. 8 and FIG. 9, horizontal and vertical axes represent frequency and attenuation, respectively.

In the first simulation, initially, the pass attenuation characteristics of the bandpass filter 101 were obtained in the situation where the capacitance $C_P$ of the capacitors 121 and 122 and the inductance $L_{CP}$ of the inductor 123 were set to such values that an attenuation pole was formed at a frequency lower than the passband frequencies. The pass attenuation characteristics thus obtained are indicated by reference numeral 61 in FIG. 8, and by reference numeral 71 in FIG. 9. As seen from the pass attenuation characteristics, a low attenuation's peak occurs at approximately 4.8 GHz, so that the attenuation in the 4.8 to 5.0 GHz frequency band is smaller than 30 dB. Such characteristics of the bandpass filter 101 cannot meet a requirement that an attenuation of 30 dB or more should be obtained in the 4.8 to 5.0 GHz frequency band. The frequency band of 4.8 to 5.0 GHz corresponds a different one of frequency bands used in wireless LANs.

In such a case, at least either the capacitance $C_P$ or the inductance $L_{CP}$ may be reduced so that the frequency at which the low attenuation's peak occurs will be shifted to a higher side than the 4.8 to 5.0 GHz frequency band. In the simulation, characteristics were then obtained with the capacitance $C_P$ reduced by about half the value applied to provide the characteristics indicated by reference numerals 61 and 71, and with the inductance $L_{CP}$ reduced by about half the value applied to provide the characteristics indicated by reference numerals 61 and 71. The characteristics obtained with the capacitance $C_P$ reduced by about half are indicated by reference numeral 62 in FIG. 8. The characteristics obtained with the inductance $L_{CP}$ reduced by about half are indicated by reference numeral 72 in FIG. 9.

Figure 8:
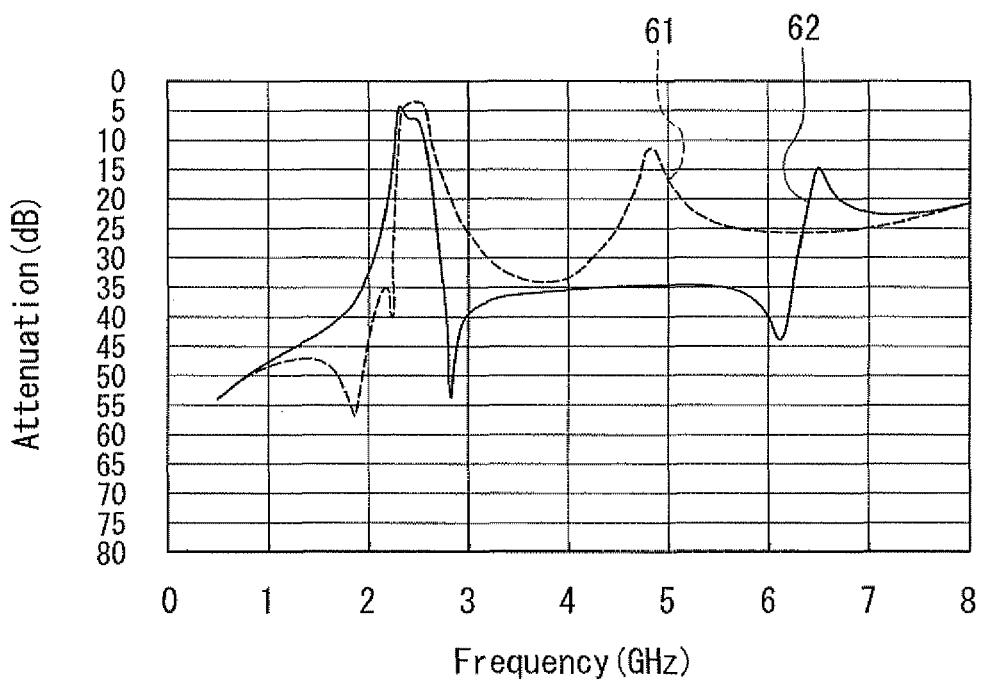
FIG. 8 is a characteristic chart showing an example of pass attenuation characteristics of the layered bandpass filter of the comparative example.
Figure 9:
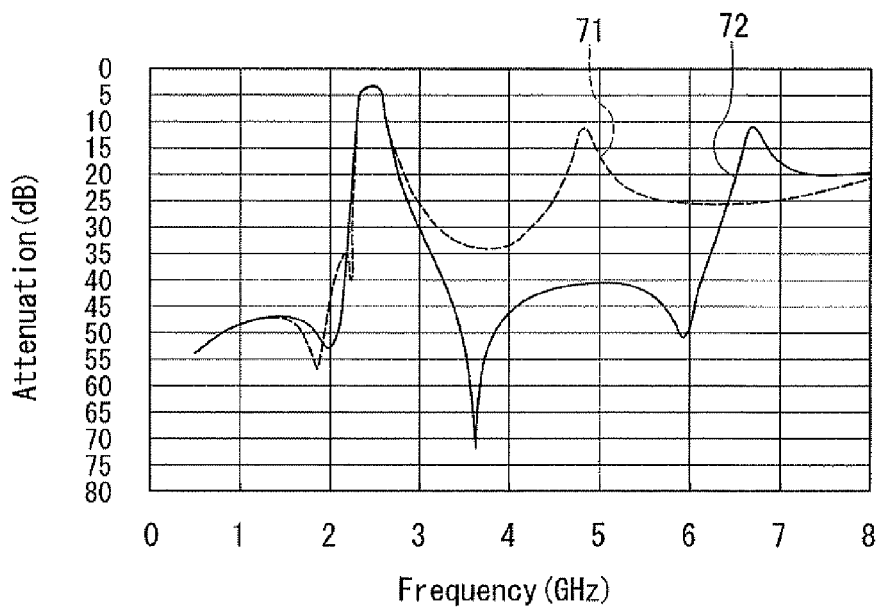
FIG. 9 is a characteristic chart showing another example of pass attenuation characteristics of the layered bandpass filter of the comparative example.

As seen from FIG. 8 and FIG. 9, in both of the cases where the capacitance $C_P$ was reduced by about half and where the inductance $L_{CP}$ was reduced by about half, the frequency at which the low attenuation's peak occurred was shifted to a higher side than the 4.8 to 5.0 GHz frequency band. Where the capacitance $C_P$ was reduced by about half, however, no attenuation pole was formed at any frequency lower than the passband frequencies. Where the inductance $L_{CP}$ was reduced by about half, there was a change in the frequency at which the attenuation pole was formed and the attenuation in the attenuation pole became smaller, as compared with the characteristics indicated by reference numeral 71. The results of the first simulation show that reducing the capacitance $C_P$ or the inductance $L_{CP}$ can shift the frequency at which the low attenuation's peak occurs to a higher side, but degrades the attenuation characteristics at frequencies lower than those of the passband.

Figure 10:
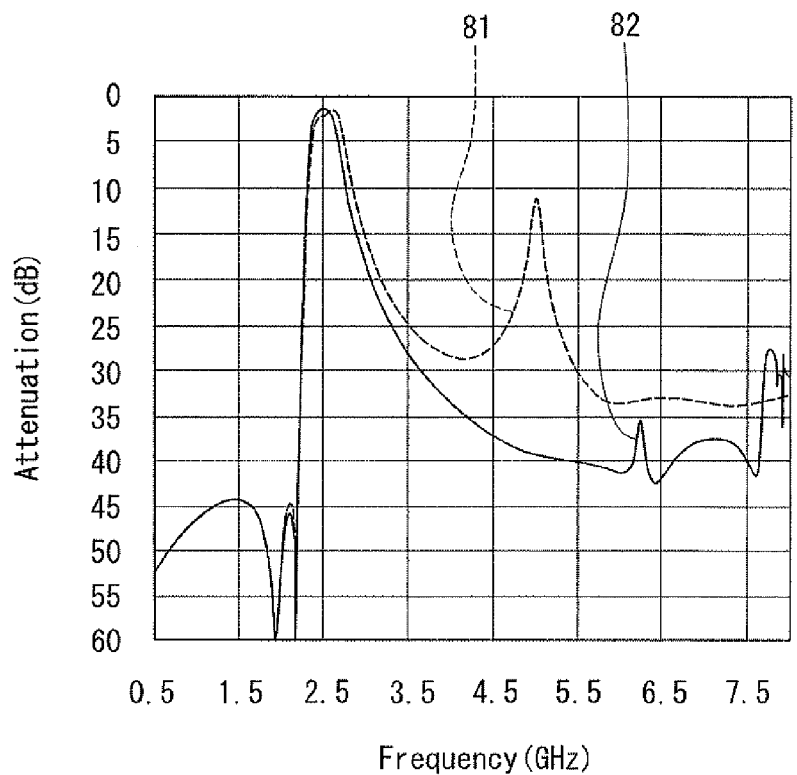
FIG. 10 is a characteristic chart showing an example of pass attenuation characteristics of each of a layered bandpass filter of a practical example of the embodiment and the layered bandpass filter of the comparative example.

Now, with reference to FIG. 10, a description will be given of the results of a second simulation which was performed compare the pass attenuation characteristics of the bandpass filter 101 of the comparative example and those of the bandpass filter 1 of a practical example of the embodiment. In this simulation, initially, the bandpass filter 101 was designed to have a passband of approximately 2.4 to 2.5 GHz and to have an attenuation pole at a frequency lower than the passband frequencies to obtain its pass attenuation characteristics. The pass attenuation characteristics of the bandpass filter 101 thus obtained are indicated by reference numeral 81 in FIG. 10. In FIG. 10, horizontal and vertical axes represent frequency and attenuation, respectively. As seen from the characteristics indicated by reference numeral 81, a low attenuation's peak occurs at approximately 5.0 GHz, so that the attenuation in the 4.8 to 5.0 GHz frequency band is smaller than 30 dB.

Like the bandpass filter 101 of the comparative example, the bandpass filter 1 of the practical example was designed to have a passband of approximately 2.4 to 2.5 GHz. In the practical example, the capacitance $C_{P1}$ of the capacitors 21 and 22, and the capacitance $C_{P2}$ of the capacitors 24 and 25 satisfy the following conditions:

$C_{P1}=aC_P$, $C_{P2}=bC_P$, $a+b=1$ (a and b are greater than 0 and smaller than 1).

As seen from these conditions, the combined capacitance of the capacitors 21, 22, 24 and 25 included in the coupling paths 7 and 8 of the practical example is equal to the combined capacitance of the capacitors 121 and 122 included in the coupling path 107 of the comparative example.

The inductances $L_{CP1}$ and $L_{CP2}$ of the inductors 23 and 26 of the practical example are both nearly equal to the inductance $L_{CP}$ of the inductor 123 of the comparative example.

As understood from the formulas (1), (2) and (3), under the aforementioned conditions of the practical example, the resonant frequencies $f_1$ and $f_2$ of the coupling paths 7 and 8 are approximately $1/\sqrt{a}$ times and approximately $1/\sqrt{b}$ times, respectively, the resonant frequency $f_0$ of the coupling path 107 of the comparative example, and are both higher than the resonant frequency $f_0$. In the practical example, a and b are approximately 0.6 and approximately 0.4, respectively. Accordingly, the resonant frequency $f_2$ is higher than the resonant frequency $f_1$. In the practical example, the resonant frequencies $f_1$ and $f_2$ are made different from each other by setting the capacitances $C_{P1}$ and $C_{P2}$ to different values. The resonant frequencies $f_1$ and $f_2$ may also be made different from each other by setting the inductances $L_{CP1}$ and $L_{CP2}$ to different values while setting the capacitances $C_{P1}$ and $C_{P2}$ to the same value. The resonant frequencies $f_1$ and $f_2$ may also be made different from each other by setting the capacitances $C_{P1}$ and $C_{P2}$ to different values and setting the inductances $L_{CP1}$ and $L_{CP2}$ to different values.

The pass attenuation characteristics of the bandpass filter 1 of the practical example are indicated by reference numeral 82 in FIG. 10. As seen from the characteristics, there are two low attenuation's peaks at approximately 6.3 GHz and at approximately 7.8 GHz. The attenuations at these two low attenuation's peaks are greater than the attenuation at the low attenuation's peak of the comparative example indicated by reference numeral 81. The pass attenuation characteristics of the bandpass filter 1 of the practical example show that the attenuation in the 4.8 to 5.0 GHz frequency band is 30 dB or greater. In principle, the frequencies at which the two low attenuation's peaks occur in the practical example are the resonant frequencies $f_1$ and $f_2$ of the coupling paths 7 and 8.

The pass attenuation characteristics of the bandpass filter 1 of the practical example also show that, at a frequency lower than the passband frequencies, there is an attenuation pole similar to that in the pass attenuation characteristics of the comparative example indicated by reference numeral 81. A possible reason therefor is that, as already described, the combined capacitance of the capacitors 21, 22, 24 and 25 included in the coupling paths 7 and 8 of the practical example is equal to the combined capacitance of the capacitors 121 and 122 included in the coupling path 107 of the comparative example.

As understood from the results of the second simulation, according to the embodiment, it is possible to form an attenuation pole at a frequency lower than the passband frequencies by setting the combined capacitance of the capacitors 21, 22, 24 and 25 included in the two coupling paths 7 and 8 to a value suitable for forming the attenuation pole. Further, according to the embodiment, it is possible to control the resonant frequencies $f_1$ and $f_2$ of the coupling paths 7 and 8, namely, the frequencies at which low attenuation's peaks occur, by adjusting the capacitance $C_{P1}$ of the capacitors 21 and 22 and the inductance $L_{CP1}$ of the inductor 23 in the coupling path 7, and adjusting the capacitance $C_{P1}$ of the capacitors 24 and 25 and the inductance $L_{CP2}$ of the inductor 26 in the coupling path 8. Thus, when low attenuation's peaks are to occur at frequencies higher than those of the passband due to the provision of the coupling path 7 and 8 for forming an attenuation pole at a frequency lower than the passband frequencies, it is possible according to the embodiment to control the frequencies at which the low attenuation's peaks occur, without impairing the function of the coupling paths 7 and 8. Consequently, according to the embodiment, it is possible to prevent spurious from being generated at frequencies higher than those of the passband by the provision of the coupling paths 7 and 8.

The present invention is not limited to the foregoing embodiment, and various modifications may be made thereto. In the foregoing embodiment, there are provided two coupling paths 7 and 8 as a plurality of coupling paths connected in parallel for forming capacitive coupling between the two resonators 4 and 6 not adjacent to each other. As an example of the modifications, three or more coupling paths may be provided as a plurality of coupling paths connected in parallel. In such a case, it is possible to form an attenuation pole at a frequency lower than the passband frequencies by setting the combined capacitance of a plurality of capacitors included in the three or more coupling paths to a value suitable for forming the attenuation pole. Also, in such a case, by adjusting the capacitance of the capacitors and the inductance of the inductor in each of the coupling paths, it is possible to generate one or more low attenuation's peaks at a frequency or frequencies higher than those of the passband and to control the frequency or frequencies at which the one or more low attenuation's peaks occur. Here, the number of the one or more low attenuation's peaks is no greater than the number of the coupling paths.

Suppose that n (n is an integer equal to or greater than 2) coupling paths having the same configuration as that of the coupling paths 7 and 8 shown in FIG. 1 are provided in parallel. The resonant frequency of each of the coupling paths in this case will be discussed. Initially, regarding the bandpass filter 101 of the comparative example having only a single coupling path 107, the capacitance of the capacitors 121 and 122 that is set to form an attenuation pole at a frequency lower than the passband frequencies will be denoted as $C_P$). In order to simplify the description, the capacitance of two capacitors included in each of coupling paths where n coupling paths are provided will be denoted as $C_p/n$. Further, the inductance of the inductor included in each of the coupling paths is set to a value equal to the inductance $L_{CP}$ of the inductor 123 of the comparative example. This makes it possible to form an attenuation pole also in the case where n coupling paths are provided. In this case, the resonant frequency of each of the n coupling paths is $\sqrt{(n)}$ times the resonant frequency $f_0$ of the coupling path 107 of the comparative example. It is seen therefrom that increasing the number n of the coupling paths can increase the resonant frequency of each of the coupling paths. The foregoing description is based on the assumption that the n coupling paths have the same resonant frequency. However, the respective resonant frequencies of the n coupling paths may be controlled independently of each other by adjusting the capacitance of the capacitors and the inductance of the inductor in each of the coupling paths. Thus, in the case where n coupling paths are provided, it is possible to generate one to n low attenuation's peaks at frequencies higher than those of the passband and to control the frequencies at which the one to n low attenuation's peaks occur.

In the foregoing embodiment, each of the coupling paths 7 and 8 includes two capacitors and one inductor. In the present invention, however, each of the plurality of coupling paths need only include one or more capacitors and one or more inductors connected in series. As an example, the coupling paths 7 and 8 may be replaced with two coupling paths each including one capacitor and one inductor connected in series. Such two coupling paths can be formed by replacing one of the capacitor-forming parts 461a and 461b of the conductor layer 461 and one of the capacitor-forming parts 462a and 462b of the conductor layer 462 with parts that are to be directly connected to the conductor layer for resonator via through holes.

While the foregoing embodiment has been described with reference to the bandpass filter 1 including three resonators, the bandpass filter of the present invention may include any number of resonators as many as or more than three.

The bandpass filter of the present invention is usefully employed as a bandpass filter in communication devices including those for wireless LANs, those compatible with Bluetooth® technology, and those compatible with WiMAX® technology.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A layered bandpass filter comprising:
   a layered structure including a plurality of dielectric layers stacked;
   three or more resonators provided within the layered structure such that adjacent two of the resonators are electromagnetically coupled to each other; and
   a plurality of coupling paths connected in parallel, for forming capacitive coupling between non-adjacent two of the resonators,
   wherein each of the coupling paths includes at least one capacitor and an inductor connected in series.

2. The layered bandpass filter according to claim 1, wherein the three or more resonators and the plurality of coupling paths are each formed of a plurality of conductor layers provided within the layered structure.

3. The layered bandpass filter according to claim 1, wherein the plurality of coupling paths have respective different resonant frequencies.

4. The layered bandpass filter according to claim 1, wherein each of the three or more resonators is a quarter-wave resonator having an open end and a short-circuited end, and the plurality of coupling paths electrically connect the open ends of the non-adjacent two of the resonators to each other.

5. The layered bandpass filter according to claim 1, wherein the at least one capacitor is two capacitors, and the inductor electrically connects the two capacitors to each other.

* * * * *

UNITED STATES PATENT AND TRADEMARK OFFICE
CERTIFICATE OF CORRECTION

PATENT NO. : 8,378,763 B2
APPLICATION NO. : 12/890120
DATED : February 19, 2013
INVENTOR(S) : Eiko Wakata It is certified that error appears in the above-identified patent and that said Letters Patent is hereby corrected as shown below:

In the Specifications column 4, line 4, "FIG. 3A to FIG. 30" to --FIG. 3A to FIG. 3C--;

column 6, line 32, "provided on the side surface 300. The" to --provided on the side surface 30C. The--;

column 14, line 63, "and adjusting the capacitance $C_{P1}$" to --and adjusting the capacitance $C_{P2}$--;

column 15, line 39, "than the passband frequencies will be denoted as $C_P$)." to --than the passband frequencies will be denoted as $C_P$.--; and column 15, line 48, "coupling paths is $\sqrt{}/(n)$" to --coupling paths is $\sqrt{(n)}$--.

Signed and Sealed this
Seventh Day of May, 2013

Teresa Stanek Rea
*Acting Director of the United States Patent and Trademark Office*